United States Patent [19]

Sachs

[11] 4,277,441
[45] Jul. 7, 1981

[54] APPARATUS FOR MONITORING CRYSTAL GROWTH

[75] Inventor: Emanual M. Sachs, Watertown, Mass.

[73] Assignee: Mobil Tyco Solar Energy Corporation, Waltham, Mass.

[21] Appl. No.: 130,816

[22] Filed: Mar. 17, 1980

Related U.S. Application Data

[62] Division of Ser. No. 3,278, Jan. 15, 1979, Pat. No. 4,242,589.

[51] Int. Cl.³ ............................................. G05D 5/00
[52] U.S. Cl. ................................. 422/105; 156/601; 156/617 SP; 156/617 V; 358/139; 422/249
[58] Field of Search .................... 422/105, 248, 249; 358/139, 305; 156/600, 601, 617 R, 617 SP, 617 V

[56] References Cited

FOREIGN PATENT DOCUMENTS 1057516 2/1967 United Kingdom .
1322582 7/1973 United Kingdom .
1392749 4/1975 United Kingdom .
1451622 10/1976 United Kingdom .
1489413 10/1977 United Kingdom .

Primary Examiner—Frank Sever
Attorney, Agent, or Firm—Schiller & Pandiscio

[57] ABSTRACT

A system and method are disclosed for monitoring the growth of a crystalline body from a liquid meniscus in a furnace. The system provides an improved human/machine interface so as to reduce operator stress, strain and fatigue while improving the conditions for observation and control of the growing process. The system comprises suitable optics for forming an image of the meniscus and body wherein the image is anamorphic so that the entire meniscus can be viewed with good resolution in both the width and height dimensions. The system also comprises a video display for displaying the anamorphic image. The video display includes means for enhancing the contrast between any two contrasting points in the image. The video display also comprises a signal averager for averaging the intensity of at least one preselected portion of the image. The value of the average intensity, can in turn be utilized to control the growth of the body. The system and method are also capable of observing and monitoring multiple processes.

3 Claims, 9 Drawing Figures

```
TEMP #1: 640.7
TEMP #2: 641.2
TEMP #3: 640.3
TIME   12:40:27
```

```
TEMP #1: 640.7
TEMP #2: 641.2
TEMP #3: 640.3
TIME·  12:40:27
```

APPARATUS FOR MONITORING CRYSTAL GROWTH

The Government has rights in this invention pursuant to Contract No. NAS7-100, JPL Subcontract 954,355 awarded by the U.S. Department of Energy.

This application is a division of my copending application Ser. No. 003,278 filed Jan. 15, 1979 for Apparatus and Method of Monitoring Crystal Growth, now U.S. Pat. No. 4,242,589 issued Dec. 30, 1980.

This invention pertains to the growth of crystalline bodies having a predetermined cross-section and more particularly to improvements in apparatus for and methods of viewing and controlling the growth of such crystalline bodies.

Various processes are now known for growing crystalline bodies. One such process commonly referred to as the Czochralski method includes the steps of simultaneously pulling and rotating the body directly from crystalline melt in a crucible so as to provide a cylindrical body of crystalline material. Where the crystalline material is silicon the cylindrical body is cut into disks for use, for example, as solar cells. Due to problems, such as material wastes, process inefficiencies, and difficulty in controlling the cross-sectional dimensions of the body being grown, a more efficient process, hereinafter referred to as the "capillary die process" has been developed. The capillary die process of growing crystalline bodies, generally utilizes a capillary die or forming member from which the body can be grown. This latter process can be carried out in accordance with various techniques.

By way of example, one such technique is described in U.S. Pat. No. 3,591,348 (issued to LaBelle on July 6, 1971) in which bodies are grown in accordance with the edge-defined film-fed growth technique (also known as the EFG Process).

In the EFG process the cross-sectional shape of the crystalline body is determined in part by the external or edge configuration of the end surface of the capillary die member. The process involves growth of a seed from a liquid film of feed material disposed between the growing body and the end surface of the die member with the liquid in the film being continuously replenished from a suitable melt reservoir via one or more capillaries in the die member. By appropriately controlling the pulling speed of the growing body and the temperature of the liquid film, the film can be made to spread (under the influence of the surface tension at its periphery) across the full expanse of the end surface formed by the intersection of that surface with the side surface or surfaces of the die member. The growing body grows to the shape of the film which conforms to the edge configuration of the die member's end surface. Thus, a continuous crystalline body of any geometric cross-sectional shape can be grown. For example, a substantially flat ribbon can be grown. Alternatively, since the liquid film has no way of discriminating between an outside edge and an inside edge of the die's end surface, a continuous hole may be grown in the crystalline body by providing in that surface a blind hole the same shape as the hole desired in the body, provided, however that any such hole in the die member's end surface is made large enough so that surface tension will not cause the film around the hole to fill in over the hole.

Another example of the capillary die process for growing crystalline bodies is described in U.S. Pat. No. 3,471,266 (issued to LaBelle on Oct. 7, 1969). This technique, sometimes referred to as the self filling tube process (the SFT process), employs a forming or die member that defines a capillary which contains a column of melt from which a crystalline body is grown and pulled. Depending upon the cross-sectional configuration of the capillary and by appropriate control of the thermal conditions in the upper end of the column of melt contained in the capillary, it is possible to grow crystalline bodies of selected materials having arbitrary selected cross-sectional shapes. Thus, by employing a forming die member having a capillary in the shape of an annulus, it is possible to grow a hollow tube. The forming member is mounted so that the capillary is connected to a reservoir pool of melt, whereby the capillary is self-filling.

Other types of processes are known. For example, processes hereinafter referred to "sheet growth process" (since the crystalline material is grown in sheets or ribbons) not only include the EFG process, but also include processes such as the "ribbon-to-ribbon" growing process as well as the web dendritic process developed by Westinghouse Electric Corporation of Pittsburg, Pa.

In all of these processes and in particular the capillary die processes such as the two types described, changes in pulling speed and growth interface temperature can affect the cross-sectional size of the growing body. Since it is a relatively easy matter to hold the pulling speed constant, once the crystalline body is grown to the desired shape, the usual practice, at least with respect to the capillary die processes such as the two types described, is to fix the pulling speed at a suitable rate and to periodically or continuously adjust the growth interface temperature (by adjusting the rate of heating) so that the body will grow to the desired state. Other techniques of controlling the growth rate and in particular the growth interface temperature include cooling by gas impingement on the body above the meniscus, or by providing a growing atmosphere of Helium. Other techniques are also known to those skilled in the art.

Accordingly, it is desirable to monitor the growing body during the growing process so as to keep the growth interface temperature and the pulling speed within prescribed tolerance limits. Several such monitoring systems are known. For example, one system (shown and described in U.S. Pat. No. 3,870,477 issued to LaBelle on Mar. 11, 1975) for monitoring the growth of tubes or rods of alpha-alumina (sapphire), is predicated upon the fact that capillary die processes of growing crystalline bodies are characterized by the presence of a meniscus of melt extending between an edge of the die member and the solid-liquid growth interface. LaBelle determined that the height (and also the degree of concavity) of the meniscus can change with changes in the operating conditions. More importantly, the height of the meniscus is affected by the temperature of the melt in the region of the solid-liquid growth interface and the pulling speed, and the outer diameter of a hollow tube or solid rod will decrease as the meniscus height increases (and an increase in the same diameter occurs if the outer meniscus height decreases). In accordance with the LaBelle method the height of the meniscus is visually measured by directly observing the meniscus through a microscope equipped with a height measuring reticle device. Visually observing changes in the height of the meniscus ideally forms a basis for determining how to vary the rate of heating to achieve the desired cross-sectional dimensions of the crystalline body being grown. However, in practice the point at which the meniscus begins and ends is not always easily discernable. This is true for example when the material is silicon and it is grown from a graphite die member resulting in silicon carbide particles being present in the meniscus, or the material is of the type which is substantially transparent to light (for example, sapphire). Additionally, since the height of the meniscus is relatively small compared to the width of the meniscus (typically from about a 1:100 to 1:300 ratio) when the microscopes provide sufficient magnification to view the height of the meniscus with adequate resolution, the entire width of the meniscus can not be seen due to the limited field of view. Temperature gradients across the width of the die, which are known to occur and cause variation in the height of the meniscus, may go undetected. Further, continual observation through the microscope of the meniscus can be psychologically, as well as physically stressful when viewing the meniscus for any length of time, giving rise to early operator fatigue and a greater possibility of error. This stress is exacerbated with it is necessary for the controller to continually alternate his attentions between the image in the microscope and the controls of the heaters in the furnace. This stress can even be greater when viewing the growth of such materials as sapphire since sapphire is substantially transparent to visible light.

Other systems for viewing and controlling the growth of crystalline bodies may directly view the entire meniscus. However, such systems are not always satisfactory. Generally, when the full width of the crystalline body is viewed with such systems, the observed meniscus is too small to provide useful information about its height dimension. For example, a three-inch wide silicon ribbon grown in accordance with the EFG process would be pulled from a meniscus having a height in the order of 10 mils. In the absence of the present invention, a system producing an image including the entire width of the meniscus would likely show the height of the meniscus with insufficient resolution.

Other systems include means for imaging either a portion of the meniscus or the edges of the viewed crystalline body just above the meniscus, onto one or more radiation sensors so that shifts in the image cause changes in the output of the sensors. The output of the sensors can be utilized with a servo control system to directly control the speed at which the crystalline body is being pulled or the power applied to one or more of the heaters in the furnace. Although this technique helps alleviate the stress and strain associated with the human machine interface of the microscope system by totaling removing the human operator from the continuing control function, such systems may be inadequate since it may be difficult to determine by a human operator exactly where the image is with respect to the sensors, and more importantly to enable an operator to view the entire growing process when desired.

In this latter regard, a great deal is yet to be learned about the growth of crystalline bodies. It has become increasingly desirable therefore to provide a system for directly viewing the entire meniscus with sufficient resolution so as to enable easy viewing of the growth of such bodies from a melt for purposes of both studying and controlling the growth of the crystalline bodies.

It is therefore a general object of the present invention to provide an improved apparatus for and method of controlling and viewing the growth of crystalline bodies, which apparatus eliminates or substantially reduces the problems associated with the prior art systems and techniques.

More specific objects of the present invention are to provide improved apparatus for and method of viewing and controlling the growth of crystalline bodies, which apparatus and method (1) provide an image for direct viewing of the entire meniscus and adjacent portion of the body being grown therefrom with adequate and sufficient resolution with respect to both the width and height of the meniscus; (2) provide an image in which the contrast is variable to alleviate the stresses and strains and operator fatigue normally associated with viewing such images, and which contrast can be varied depending upon the portion of the image to which the viewer has an interest; (3) provide an improved interactive control system with a relatively unstressful human-machine interface wherein the image of the meniscus and an image of various control data can be viewed simultaneously; (4) simultaneously provide an image of various instrument control data and an image of the meniscus and adjacent body, so as to reduce the lag time between the time a determination that corrections should be taken in the growing process and the time they are actually made; (5) are easily adapted to be used with multiple growing apparatus whereby several growing processes occurring simultaneously can be viewed with the same apparatus.

The foregoing and other objects of the present invention are achieved by improved apparatus for and method of viewing and controlling the growth of a crystalline body grown from a meniscus of melt material which joins the body at a junction, referred to hereinafter as the solid/liquid/vapor junction. The apparatus comprises optical means for forming an image including the junction and the portions of the body and meniscus adjacent the junction. The image is anamorphic so that the entire width of the junction and contiguous portions of the body and meniscus can be observed, and the observed height dimension of the image is enlarged with respect to the width dimension to provide the desire resolution and field of view in both dimensions. The apparatus also comprises video display means for displaying the image. The video display means comprises means for enhancing the contrast between any two contrasting points in the image so as to improve the human machine interface with a decrease in operator stress, strain and fatigue. The video display means also includes means for averaging the intensity of at least one preselected portion of the image, the preselected portion being such that a change in the average value of intensity of the portion of the image indicates a change in the growing conditions. The average value of the intensity can therefore be used to control the growth of the body.

Other features and specific objects of this invention are set forth in the following description which is to be considered together with the drawings wherein.

Figure 1:
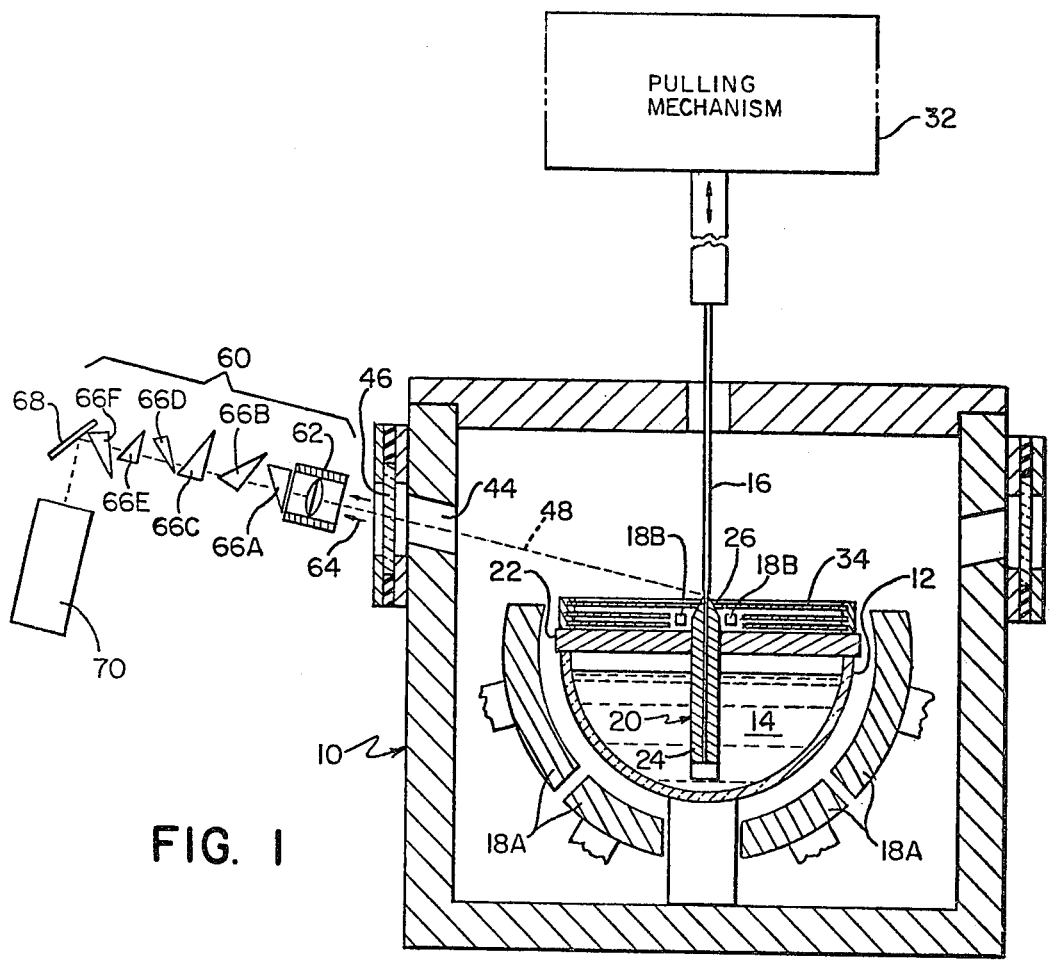
FIG. 1 is a sectional view, in elevation, of a crystal growing furnace, incorporating a preferred embodiment of the apparatus of the present invention, with certain parts represented schematically, and illustrates the growth of a crystalline body according to a capillary die process.
Figure 2:
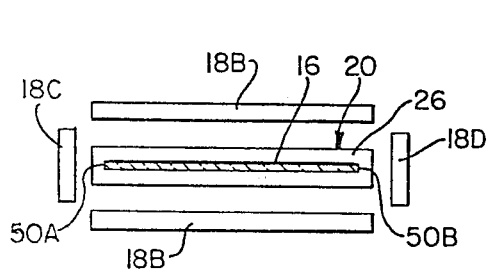
FIG. 2 is a partial schematic plan view of the die top and the face and end heaters of the furnace of FIG. 1.

Referring to FIG. 1, a furnace 10 (of the type for growing crystalline bodies of an open geometric shape, e.g., sheets or ribbons, in accordance with a sheet forming process and in particular the EFG process) is provided with a suitably supported crucible 12. The crucible contains a melt material 14 from which the crystalline body 16 is being grown, the melt material being maintained at a predetermined temperature by one or more heater elements 18. In the type of furnace shown the heater elements include main crucible heaters 18A, face heaters 18B (shown in cross-section in FIG. 1 and schematically in FIG. 2) which extend horizontally across the top of the crucible adjacent the capillary die or forming member 20 and end heaters 18C and 18D (shown schematically in FIG. 2) which extend horizontally across the top of the crucible adjacent the opposite ends of the die member 20. The capillary die or forming member 20 is supported by the plate 22 resting on the crucible so that the bottom 24 of the die member extends into the melt material 14 while the top 26 of the die member extends above the plate 22. The capillary die member 20, as shown, is similar to the type of the die member employed in the EFG process previously mentioned and described in detail in U.S. Pat. No. 3,591,348. Generally, the cross-sectional shape of the crystalline body 16 is determined by the external or edge configuration of the upper or top end 26 of the die member 20. By way of example, the die may be designed for growing a thin flat ribbon, in which case FIG. 1 may be considered as presenting a side edge view of the die with the longer horizontal dimension of the ribbon, i.e., its width, being perpendicular to the plane of the drawing of FIG. 1. Such a die member is preferably oriented so that when a flat ribbon is being grown, the longer dimensioned sides of the ribbon are disposed in a parallel-spaced relationship with the general plane in which the face heaters 18B are disposed so that the latter generally provide uniform heat across the face of the top 26 of the die member. Similarly, as shown in FIG. 2 the end heaters 18C and 18D are disposed at the opposite edges of the top edges of the die member so that heat is provided to the top edge of the top 26 of the die member and the portion of the meniscus film, both adjacent the particular heater. Thus, heaters 18 are utilized to control the temperature distribution across the top of the die member in the melt material forming the meniscus 30.

Figure 3:
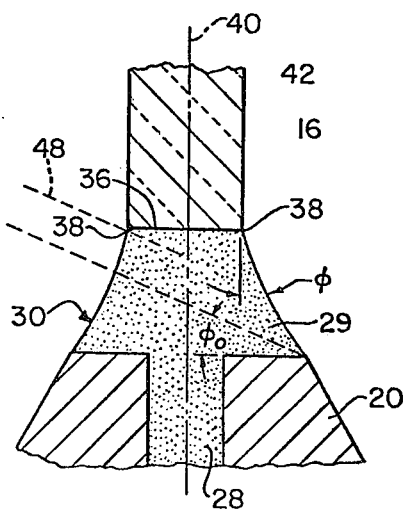
FIG. 3 is an enlarged cross-sectional view of a typical crystalline body grown from a meniscus formed on the top surface of a die member.

As shown more clearly in FIG. 3, the die member 20 includes at least one capillary 28 so that the liquid in the meniscus film 29 formed between the top of the die member 20 and the crystalline body 16 can be continuously replenished from the reservoir of melt material 14 (shown in FIG. 1) as the body 16 is being pulled. Referring again to FIG. 1 the body 16 is pulled at a constant speed along a pulling axis 40 by the pulling mechanism 32. In order to provide a more uniform temperature of the meniscus during steady state conditions, a plurality of thin radiation shields 34 are provided on the plate 22 around the die member 20.

Although not shown, the furnace 10 can be constructed to include a cartridge (such as the one shown in U.S. Pat. No. 4,118,197 issued Oct. 3, 1978 to MacKintosh et al) containing selected crystal growth components.

As shown more clearly in FIG. 3, the meniscus 30 of film 29 intersects the body 16 at the solid/liquid interface 36, which in turn forms the solid/liquid/vapor junction 38. During steady state conditions (when the body 16 is being pulled at a constant speed and the temperature distribution in the melt material is substantially constant so that the cross-sectional dimensions are substantially constant) the solid/vapor interface 42, i.e., the surface of body 16, is parallel to the pulling axis 40.

It has recently been discovered that during capillary die processes of growing at least some crystalline materials, such as silicon and germanium, the vertical meniscus 30 joins the crystalline body at the junction 38 at a discernable meniscus angle. This meniscus angle $\phi$, defined by the angle which is formed between the extension of the interface 42, with respect to the extension of the surface of the meniscus at the junction 38 as shown in FIG. 3, has been determined to remain constant, for at least some materials such as silicon and germanium during the growth of uniformly dimensioned crystalline bodies of such materials. (See Surek, T. and Chalmers, B; "The Direction of Growth of the Surface of a Crystal in Contact with its Melt"; Journal of Crystal Growth; Volume 29, p. 1–11 (1975)). More specifically, a steady state meniscus angle $\phi_o$ will occur during steady state conditions when the pulling speed of the crystalline body as well as the growth interface temperature are substantially constant. For silicon, for example, the steady state meniscus angle is $11° + 1°$, while for germanium the steady state meniscus angle is approximately 8°. It has further been observed that, at least for silicon, the steady state meniscus angle will not be appreciably affected by variations of nearly two orders of magnitude in the crystal growth rate even though changes in meniscus height occur.

Since meniscus height is one essential parameter for controlling the growth of the crystalline body, the steady state meniscus angle phenomenon can be taken advantage of. More specifically, a technique for maximizing the contrast between the meniscus 30 and body 16 is to view the junction 38 at an angle perpendicular to the surface of the meniscus formed at the junction under steady state conditions. By viewing the junction at this angle more reflected radiation can be seen from the surface 42 of body 16 at junction 38 than the surface of meniscus 30 at junction 38 due to the angle of view. Further, a contrast between the meniscus and body can be observed since the emissivity of radiation in the visible region of the electromagnetic spectrum from the liquid meniscus is approximately half that from the solid body. Accordingly, the furnace 10 of FIG. 1 is provided with corresponding windows 46 and located so that the solid/liquid/vapor junction 38 and adjacent surfaces of the meniscus and body can be viewed at an angle along the viewing axis 48 where a contrast between the meniscus and body can be observed. Thus, by viewing the junction 38 through ports 44 along the axis 48 the height of the meniscus can be observed and controlled.

Since the positions of the opposite edges 50A and 50B relative to each other as well as relative to the ends of the die member 20 are related to the height of the meniscus and thus the cross-sectional dimensions of the body being grown, the position of edges provides a measure by which one can control the growth of the body. The positions of the edges can be controlled by such techniques as controlling the pulling speed or the power to each of the end heaters 18C and 18D.

To the extent described the above apparatus of FIGS. 1-3 and viewing techniques are known. However, present systems for observing the meniscus 30 and/or the opposite edges 50 are inadequate for one or more of the following reasons. Viewing the meniscus along axis 48 at an angle perpendicular to the surface of the meniscus where it joins the junction 38 during steady state conditions is satisfactory for enhancing the contrast so as to better view the junction. However, for direct viewing through for example, a microscope, the actual height of the meniscus is often undiscernable. Thus, such a technique is more useful when using radiation sensors to detect the relative position of the junction 38 such as shown and described in U.S. Pat. Nos. 4,184,907 and 4,185,076, both issued on Jan. 22, 1980. However, using sensors can be unsatisfactory, where direct viewing is desirable, particularly, where it is preferred that the operator continually view the process while it is occurring. A further disadvantage from viewing the meniscus height directly with a microscope is the operator stress, strain and fatigue associated with such viewing. Further, since one cannot view the entire width of the meniscus without swiveling the microscope, the entire meniscus cannot be viewed simultaneously. Thus, thermal gradients across the die top of the die member 20 may go undetected.

The alternative technique (disclosed in U.S. Pat. No. 4,239,583 issue to Hatch et al on Dec. 16, 1980) of viewing the opposite edges 50A and 50B of the body 42 just above junction 38, can be accomplished by direct viewing or by utilizing sensors due to the difference in contrast between the body 42 and the background within the furnace 10. Again, the direct viewing system has advantages over the sensing type systems. Although the direct viewing technique allows one to view the entire width of the meniscus, it has been found to be entirely unsatisfactory in viewing the meniscus with adequate resolution, particularly where one desires to observe and study the meniscus during the growth of the crystalline body.

Other advantages and disadvantages of the various direct viewing and sensing systems will be obvious to persons skilled in the art. The present invention essentially combines many of the advantages of the various systems while substantially reducing or eliminating many of the disadvantages. The improved system of the present invention enables the observer to view the entire width of junction 38, meniscus 30 and adjacent portion of body 42, while simultaneously viewing the height of the meniscus with adequate resolution. The operator can directly view the growth of the body 42 with relatively reduced stress and strain then that associated, for example, with the microscope. As a result an improved interactive system is provided with an improved human-machine interface whereby easier control over the machine can be maintained by the operator with less operator fatigue.

Figure 4:
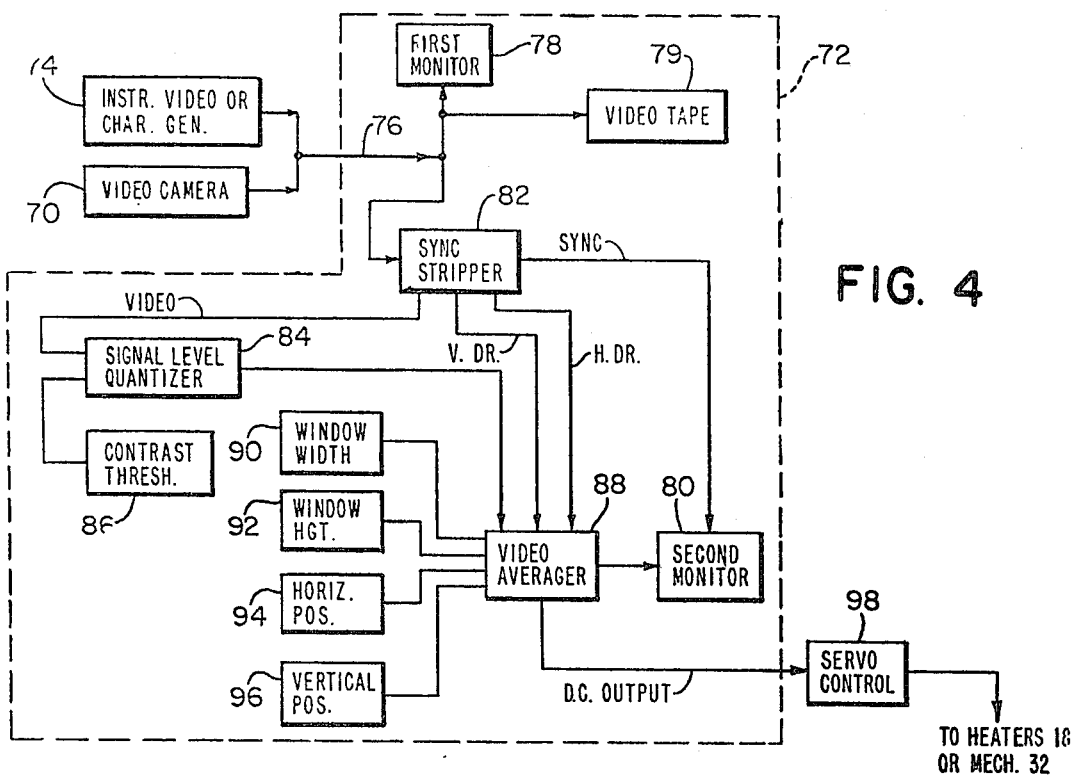
FIG. 4 is a block diagram of the preferred embodiment of the apparatus of the present invention.

Referring to FIGS. 1 and 4, a preferred embodiment of the system of the present invention is described. The system generally includes optical means, indicated generally at 60 in FIG. 1, for forming an image including junction 38 and portions of meniscus 30 and body 42 adjacent junction 38. The image formed is anamorphic so that the entire width of the junction 38 and adjacent portions of the meniscus 38 and body 42 can be observed, and so that the observed height dimensions of the meniscus and body portions are enlarged with respect to the width dimensions. As well known an anamorphic optical system is a system comprising at least one optical element having a different power of magnification in one principal meridian than in the other. (See for example, U.S. Pat. No. 4,059,343 issued to Kowalski et al on Nov. 22, 1977; or Smith, Warren J.; *Modern Optical Engineering: The Design of Optical Systems.* McGraw-Hill Book Company (New York) 1966; pp. 239–241). In the present invention the principal meridian in which greater magnification is provided is generally the vertical dimensions of the image so that greater resolution of the vertical dimension of the junction and adjacent portions of the meniscus and body are provided. Preferably, optical means 60 includes a collimating lens 62 for collimating the light rays 64 transmitted along viewing axis 48. Means 60 also includes prismatic means 66 for providing the desired magnification of rays 64 in the principal meridian. Prismatic means 66 preferably includes six prisms 66A, 66B, 66C, 66E and 66F for providing twenty times the magnification in the principal meridian than in the other. It will be appreciated that the number of prisms and the desired magnification in the principal meridian can vary depending on such factors as the size of the original object being viewed, and the resolution desired. Further, other anamorphic optics can be used to provide the desired magnification in the principal meridian such as cylindrical lenses. With the prisms 66 as shown, prism 66A receives the collimated rays 64 from lens 62 and spreads or refracts the rays in the principal median without affecting them in the other meridian. Prism 66B similarly receives the rays from prism 66A and further spreads or refracts the rays in the principal meridian without effecting them in the other. Prisms 66C, 66D, 66E and 66F provide further magnification in the principal meridian only.

Finally, the rays are reflected from the final prism 66F to a video camera 70 by means 68 in the form of a prism or mirror, for reflecting the rays 64. Camera 70 is any device for forming and converting the image represented by rays 64 passing through the prisms 66 and reflected by means 68, (typically by repetitively scanning the image formed) into an electrical signal represented of the image. The electrical signal typically includes the two signal components, one being the video signal. The video signal is usually an analog signal whose signal intensity varies with changes in intensity of the corresponding image portions of each image scanned. The second signal component provided by camera 70 is generally referred to as the sync signal which provides a reference as to the beginning and ending of each scan of the image as represented by the video signal. Camera 70, for example, may be an image orthicon or may be an image vidicon. Other such devices are well known in the art.

Referring to FIG. 4, the electrical signal thereby generated by camera 70 is transmitted to the video system 72. In the preferred system, data relative to the growth of body 42 is derived from data signal generating means 74. For example thermocouples may be placed at various locations within the furnace for measuring the local temperatures at each of these locations. Similarly, the date and time at which the body is being grown may be of interest. The various parameter measurements can be visually indicated on appropriate instrument panel or may simply be provided in the form of an electrical video signals. Accordingly, means 74 may be either a second video camera positioned to convert an image of an instrument panel visually indicating the parameter values of interest into a second electrical signal or a system for generating such video signals directly derived from the measuring instruments such as the thermocouples. In either case the electrical signals generated by data signal generating means 74 is synchronized with the video signal provided by camera 70 so that both can be displayed as adjacent superimposed images. The transmission of the electrical signals generated by camera 70 and generating means 74 to system 72 is accomplished in any suitable manner, such as directly over line 76, or alternatively by FM transmission through the air.

For reasons which will be more evident hereinafter system 74 preferably includes first and second video monitors 78 and 80, respectively. Monitor 78 displays the images provided by camera 70 and means 74 based on the sync and analog video signals received from both over line 76. In this regard the sync and analog video signals can be recorded on video tape recorder 79, so that is desired the sync and video signals provided to monitors 78 and 80 can be derived from those prerecorded on the video tape recorder 79. Monitors 78 and 80 (not shown in detail) are cathode ray tubes, each generally including an electron gun for producing an electron beam responsively to the video signal received, means responsive to horizontal and vertical drive signals for varying the position of the electron beam to produce a raster scan and a target responsive to the electron beam for displaying the image. The monitor 78 provides a composite image of the meniscus 30, junction 38 and body 16 similar to the images formed by camera 70 and means 74. Monitor 78 accordingly includes all the necessary structure for producing these images from the signals received over line 76. Monitor 80 provides an image of which the representation shown in FIG. 5 is typical.

Among other things the system 72 is generally designed to enhance the contrast between various portions of the image of the meniscus and adjacent body and die member to allow the operator to easily observe and study the growth of the body from the meniscus and to preferably perform the necessary control functions used to control the growth of the body. More specifically, system 72, preferably includes means, in the form of sync stripper 82, for separating the video and sync signals derived from the electrical signals received from camera 70 and means 74, and for generating the horizontal and vertical drive or sweep signals for monitor 80. The horizontal and vertical drive signals are generated in response to the sync signal and as well known are used in the monitor 80 to vary the position of the electron beam to produce the raster scan of the target in order to produce the image on the target. In order to enhance the contrast of any two contrasting points in the image of monitor 80 the composite analog video signal provided from sync stripper 82 is applied to means, preferably in the form of signal level quantizer 84 for converting the analog signal to a digital signal. Quantizer 84 is preferably in the form of a threshold detector adapted to compare the amplitude level of the analog video signal with a reference D.C. voltage the latter is set by the operator by varying the contrast threshold control 86. When the analog video signal exceeds the threshold level set by control 86 the output of quantizer 84 is a relatively large D.C. signal and when the analog video signal is equal or is below the threshold level, the output of quantizer 84 is a relatively small D.C. signal. The digitized output of quantizer 84 is fed, together with the vertical and horizontal drive signals from the sync stripper 82 to a video signal averager 88.

Figure 5:
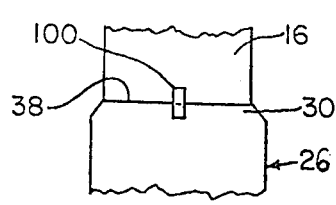
FIG. 5 is a pictorial representation of a typical video display provided by the embodiment described in FIGS. 1 and 4.

Averager 88 is adapted to average the intensity values of the portions of the digitized signal of the raster scan represented by that portion of the image in the window 100 shown in FIG. 5. More specifically, averager 88 includes controls 90, 92, 94 and 96 for providing and adjusting the size and position of window 100 in the image of FIG. 5. Through controls 90 and 92 the operator can control respectively the width and height of window, while through the controls 94 and 96, the observer can control respectively the horizontal and vertical positions of the window. As will be more apparent hereinafter, by adjusting the size and position of the window 100 so that it appears to over-lap a portion of the junction 38 and the adjoining meniscus 30 and body 16, a control signal can be generated to control the growth of body 16. Averager 88 averages that portion of the digitized video signal provided by quantizer 84 within window 100 and provides a D.C. output signal on line 102 representative of that average. Averager 88 also provides the digitized video signal provided by quantizer 84 together with a signal portion representative of the image of window 100 to the video monitor 80. The D.C. output on line 102 can be visually displayed to the operator, or as shown in FIG. 4 applied to servo-control system 98 of a type well known in the art which in turn can control the pulling speed at which the body 16 is being pulled by mechanism 32, control the power to heaters 18 or control the growth of the body in any other manner known in the art. For example, although not shown in detail, system 98 may include an SCR switching circuit comprising error detecting means for detecting the difference between a set value of the output of averager 88 (as determined by the operator) when the preferred conditions exist and the actual output of averager 88, an integrator for integrating the error signal thus produced, with the resulting integrated signal being used to control an SCR switch. The latter, in turn can be used to control the power to either pulling mechanism 32 or heaters 18 in response to the D.C. signal level over line 102. The sync signal provided by stripper 82 is utilized to provide the raster scan and thus the image display on monitor 80.

The system 72 may be composed of any known system components for performing the functions indicated. For example, monitors 78 and 80 and recorder 79 can be any television and television video recorders, respectively, currently commercially available. Sync stripper 82, signal level quantizer 84 and video averager 88 are all commercially available as Model Nos. 302-2, 606-5 and 310 respectively, from Colorado Video, Inc. doing business in Boulder, Colo.

In operation optic means 60 and camera 70 are preferably positioned as shown in FIG. 1 so as to view the meniscus 30 and body 16 along viewing axis 48 so that a maximum contrast is provided in the image viewed between the meniscus and body at the junction 38. Due to the anamorphic nature of optic means 60, the entire meniscus 30 can be viewed with good resolution of both the height and width dimensions. The image of the meniscus and surrounding structure is formed by optics 60 and focused by the focussing optics (not shown) of camera 70. Simultaneously, suitable measurements of various parameters which may be of interest can be made during the growth of the crystalline body and a second video signal representative of and derived from these measured parameters can be generated by character generating means 74. The combined video and sync signals provided by camera 70 and generating means 74 are transmitted over line 74, where the complete image can be viewed by first monitor 78 and if desired recorded by recorder 79. Although the contrast of the image displayed on the monitor 78 can be varied, between any two contrasting points in the image can be further enhanced by transmitting the combined video signal either directly from line 76 or from recorder 79 to stripper 82. The combined video signal is stripped from the sync signal and applied to the input of quantizer 84. By properly setting the contrast thershold with control 86, portions of the image of the body and meniscus which might be difficult to discern in the image formed on the first monitor, can easily be distinguished on the second monitor. For example, during steady state growth, viewing the growth of the body 16 from meniscus 30 along axis 48 a contrast between the body 16 and meniscus 30 at junction 38 can be observed on the first monitor 78, since a greater amount of reflected light is received from the surface of body 16 than the surface of meniscus 30 at junction 38 due to the steady-state meniscus angle between the two. However, by setting control 86, so that the threshold contrast setting is (1) above those portions of the video signal received from stripper which are representative of those portions of the meniscus 30 at junction 38 and (2) below those portions of the video signal received from stripper which are representative of those portions of body 16 at junction 38, the combined video signal is digitized so as to enhance the contrast between the body and meniscus at the junction. The digitized output of quantizer 84 is applied to video averager 88, which in turn provides the additional video signal representative of the window 100 to the second video monitor 80. Monitor 80 also receives the sync signal from stripper 82 so that the images created by optics 60, means 74 and the averager 88 are displayed on the screen to create a composite image, the representation shown in FIG. 5 being typical. The system can be used to control the growth of the body 16 so as to maintain steady state growth of the body, by simply adjusting the size and position of window 100 so that window 100 covers at least a portion of the junction 38 as shown in FIG. 5. Averager 88 provides a D.C. output signal representative of the average intensity of the portion of the image within the window. Since an enhanced contrast exists between the meniscus and the body in the image display of the second monitor 80, the D.C. output signal of averager 88 changes with changes in the vertical position of junction 38 which occurs when there is a change in growing conditions. The servocontrol system 98 accordingly can be adjusted to provide a positive or negative error signal depending upon whether the junction 38 moves up or down. The error signal accordingly is used to either control the power to heaters 18 so as to increase or decrease the power to the heaters or to control the power to pulling mechanism 32 so as to increase or decrease the pulling rate of the body 16 from the meniscus 89.

Figure 6:
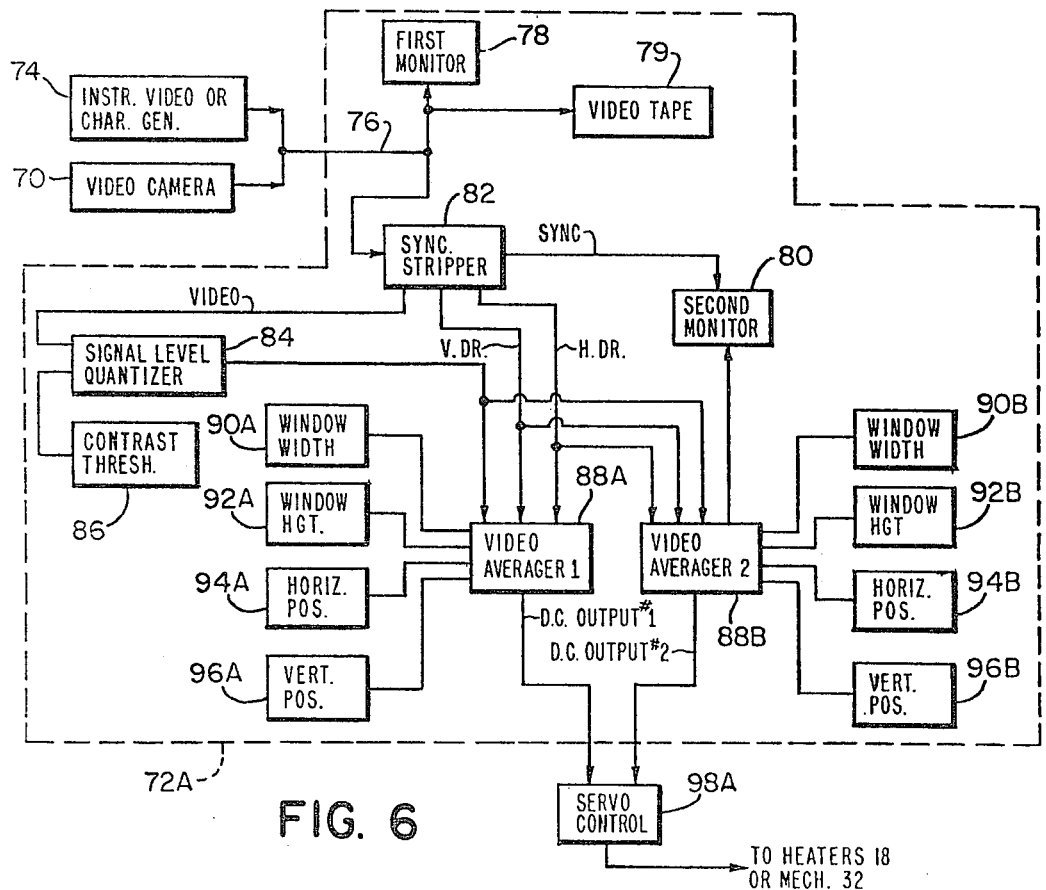
FIG. 6 is a block diagram illustrating a second embodiment of the apparatus of the present invention.

The principles of the present invention can also be utilized in controlling the growth of body 16 by controlling the position of the opposite edges 50A and 50B of body 16. This is provided by the system shown in FIG. 6. Specifically the system of FIG. 6 is identical to the system of FIG. 4, except that the system 72A comprises a second video averager for providing a second window in the image as well as a second D.C. output signal so as to control the power to the heaters 18 or pulling mechanism 32. More particularly, the output of quantizer 84 is connected to two averagers 88A and 88B, each operating identically to the averager 88 of FIG. 4. Similarly, the vertical and horizontal drive signals generated by stripper 82 are both provided to each of the averagers 88A and 88B. Each averager 88A and 88B is provided with separate controls 90, 92, 94 and 96 so as to control the size and positions of windows 100A and 100B shown in the pictorial representation of FIG. 7. The D.C. output signals provided by the averagers 88A and 88B may be fed to display meters, or alternatively, as shown, to a servo control system 98A for controlling the power to heaters 18 or the pulling mechanism 32. The latter, may simply contain an averaging circuit for averaging the D.C. signal outputs of averagers 88A and 88B. The averaging circuit in turn can provide an output representative of the average of the two D.C. signals. The output can then be used to regulate the power to drive mechanism 32 in a manner well known in the art so that as the edges 50A and 50B (shown in the image of FIG. 7) move toward and away from one another (indicating respectively that the body is being pulled to fast or too slow) the power to mechanism 32 can be respectively decreased or increased to decrease or increase the pulling speed of the body 16. Alternatively, servo control system 98A can be two SCR switching circuits of the type described with respect to system 98 of FIG. 4. Each such SCR switching circuit in turn can be used to control the power to the edge heaters 18C and 18D in a manner well known in the art. Accordingly, the power to each edge heater 18C and 18D is selectively controlled and varied depending upon whether the edge 100A or 100B moves in toward the center pulling axis 40 (indicating the need for a decrease of power to the corresponding edge heater) or moves away from the center pulling axis 40 (indicating the need for an increase of power to the corresponding edge heater). Other control systems are well known in the art.

Figure 7:
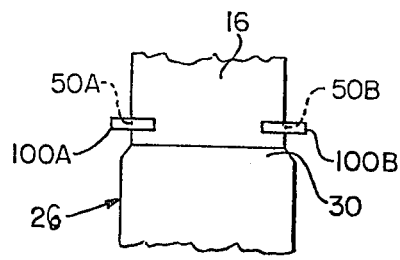
FIG. 7 is a pictorial representation of a typical video display provided by the embodiment described in FIG. 6.

The operation of the FIG. 6 system is identical to that of the FIG. 4 system to the extent that the video and sync signals provided by camera 70 and generating means 74 are transmitted over line 76 to the first video monitor 78 and video tape recorder 79, and to sync stripper 82. The latter separates the combined video seignals from the sync signal and generates the horizontal and vertical drive signals. The contrast threshold level determined by control 86 is set (1) above the video signal levels representative of the background of the image behind the body 16 and (2) below the video signal levels representative of the body 16, so as to increase the intensity between the body 16 and the background at the edges 50 in the display image of the second video monitor 80 as shown in FIG. 6. The output of quantizer 84 as well as the horizontal and vertical drive signals are fed to both averagers 88A and 88B so that the two windows 100A and 100B are provided. The position and size of each of the windows 100A and 100B are adjusted by controls 90A, 92A, 94A, 96A, 90B, 92B, 94B and 96B so that in the image display of the second monitor, windows 100A and 100B overlap the respective edges 50A and 50B just above meniscus 30 as illustrated in FIG. 7. By achieving steady state growth conditions of the body 16, the D.C. outputs of averagers 88A and 88B determine the reference output levels. Accordingly, shifts in one or both edges 50A and 50B will provide for changes in one or both of the D.C. output levels of averagers 88A and 88B. There changes can be indicated visually or as shown in FIG. 6 fed to servo system 98A so that the power to pulling mechanism 32 or to edge heaters 18C or 18D is adjusted to maintain steady state growth.

Figure 8:
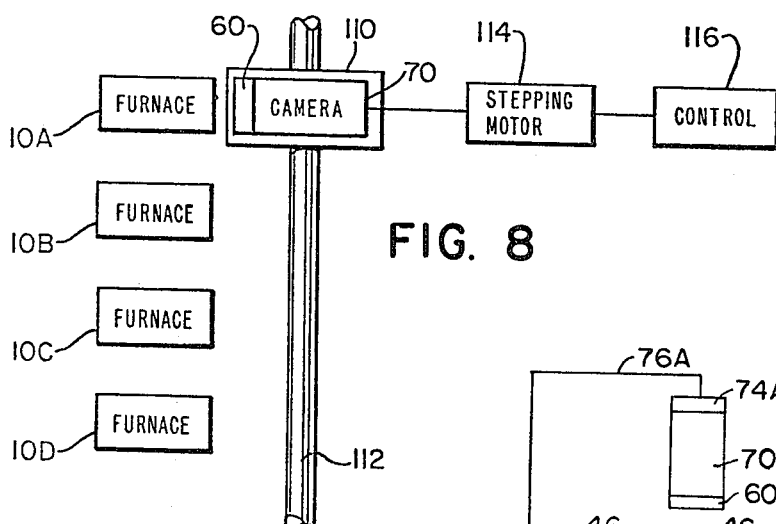
FIG. 8 is a schematic diagram illustrating a modification of the embodiments described with respect to FIGS. 1 and 4–7.
Figure 9:
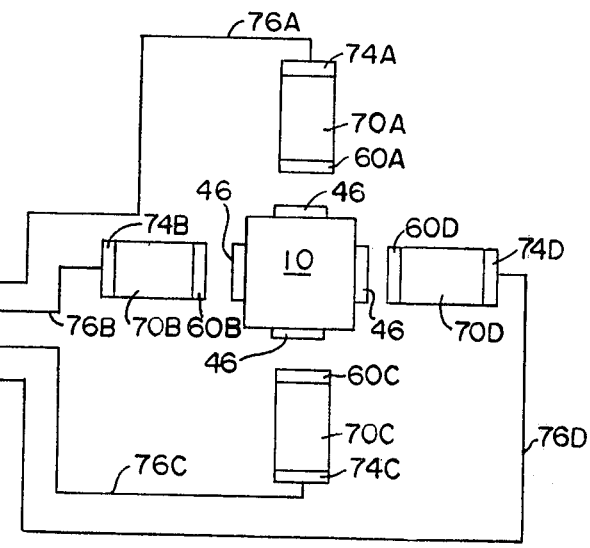
FIG. 9 is a schematic, block diagram of another modification of the embodiments described with respect to FIGS. 1 and 4–7.

Although the present invention has been described in its preferred form, it will be evident that certain changes can be made without departing from the principals of the present invention. For example, the systems shown in FIGS. 4 and 6 are each described for use with a single furnace 10. However, where it is desired to view the growth of bodies in several furnaces with a single system, either the systems of FIG. 4 or FIG. 6 can easily be adapted. More specifically referring to FIG. 8, camera 70 and optics 60 can be mounted on a common support 110 coupled to and adapted to move on track means 112. Track means 112 is positioned relative to a plurality of furnaces, (for example four furnaces 10A, 10B, 10C and 10D being shown in FIG. 8) so that camera 70 and optics 60 can be selectively moved into position relative to each of the furnaces 10 so that the body 16 being grown in any one particular furnace can be observed. Means, such as reversible stepping motor 114, responsive to control 116 can be coupled to support 110 for moving camera 70 and optics 60 on track 112 in either direction.

Where it is desirable to view the growth of several crystalline bodies grown in a single furnace the present invention can easily be accommodated to provide apparatus for viewing each crystalline body being grown, each through a different window 46 of the furnace 10. For example, a separate system comprising a camera 70, optical means 60 and corresponding video system 72 can be positioned relative to each window 46 in the manner previously described. Alternatively, as shown in FIG. 9, a multiplexing scheme can be employed to utilize a single video system 72 with a plurality of cameras 70 and their respective optical means 60. More specifically, the apparatus shown comprises four cameras 70A, 70B, 70C and 70D and associated optical means 60A, 60B, 60C and 60D for observing the growth of corresponding crystalline bodies in furnace 10 through four different windows 46 of the furnace. It should be appreciated that the number of cameras 70 and associated optical means is not limited to four but can vary depending upon the design of furnace 10, the number of bodies being grown, and other design considerations. The output signal of each camera 70 along with the corresponding output of generating means 74 is provided over a respective line 76 to multiplexor 120. Multiplexors are well known in the art. Generally, multiplexors 120 is designed to sequentially and repetitively transmit the signals transmitted over lines 76A, 76B, 76C and 76D to the single video system 72. The video display can include an indication of which line 76 is being transmitted through multiplexor 120 to indicate to the observer which crystalline body image the display is providing.

The invention thus described has several advantages. The growth of a crystalline body, such as a silicon or germanium body, can be easily observed and monitored as well as controlled. By anamorphically magnifying one principal meridian, i.e. the vertical dimension, of the image of the meniscus and adjacent portion of the body, with respect to the other principal meridian, i.e. in the horizontal direction of the image, the entire meniscus can be observed with sufficient resolution in both directions. By displaying the image on a video display, such as monitors 78 and 80, the growing process can be easily observed with little or no physical and psychological stress and strain on the observer. The use of quantizer 84 enables the observer to further enhance the contrast between any two positions of the image of the meniscus and body with the further ability to adjust the threshold level with control 86 at which the enhanced contrast is provided. By utilizing the averagers 88, 88A and 88B, control of the growth of body 16 can easily be achieved. Finally, the overall advantage of the invention is to improve the human/machine interface so as to facilitate and ease the conditions under which the growth of crystalline bodies can be observed, studied, monitored and controlled. Other advantages will be evident to those skilled in the art.

Since certain changes may be made in the above apparatus without departing from the scope of the invention herein involved, it is intended that all matter contained in the above description or shown in the accompany drawings shall be interpreted in an illustrative and not in a limiting sense.

What is claimed is:

1. A system for controlling the growth of a crystalline body of selected material from a growth pool of melt so that said body has a selected cross-sectional shape for some predetermined distance along its length, said growth pool being characterized by a meniscus which joins said body at said growth pool to form a solid/liquid/vapor junction, said system comprising
   (1) means, including a crucible for heating said material, for establishing said growth pool,
   (2) optical means for forming an image of at least the entire width of said junction and the portions of the body and meniscus above and below said junction;
   (3) video display means for displaying said image, said video display means comprising
      (a) means for generating a video signal representative of said image;
      (b) averaging means for averaging the amplitudes of portions of the video signal representative of at least one preselected portion of said image, and
      (c) means for generating an electrical signal representative of the average of said amplitudes; and
   (4) means responsive to said electrical signal for controlling the growth of said body.

2. A system according to claim 1, wherein said means for generating said video signal includes means for generating an analog signal representative of said image and means for digitizing said analog video signal so as to produce a digitized video signal, and wherein said averaging means averages the amplitude of portions of the digitized video signal.

3. A system according to claim 2, wherein said means for digitizing said analog video signal comprises means for comparing the amplitude of said analog video signal with a predetermined threshold level and for providing said digitized video signal at a first signal level when said analog video signal exceeds the threshold level and at a second level when said analog video signal is below said threshold level.

* * * * *